(12) United States Patent
Sanuki et al.

(10) Patent No.: US 11,862,246 B2
(45) Date of Patent: Jan. 2, 2024

(54) MEMORY SYSTEM

(71) Applicant: Kioxia Corporation, Tokyo (JP)

(72) Inventors: Tomoya Sanuki, Yokkaichi (JP);
Yasuhito Yoshimizu, Kawasaki (JP);
Keisuke Nakatsuka, Kobe (JP); Hideto Horii, Yokohama (JP); Takashi Maeda, Kamakura (JP)

(73) Assignee: Kioxia Corporation, Tokyo (JP)

( * ) Notice: Subject to any disclaimer, the term of this patent is extended or adjusted under 35 U.S.C. 154(b) by 150 days.

(21) Appl. No.: 17/474,904

(22) Filed: Sep. 14, 2021

(65) Prior Publication Data

US 2022/0301625 A1    Sep. 22, 2022

(30) Foreign Application Priority Data

Mar. 19, 2021  (JP) ................................ 2021-046262

(51) Int. Cl.
| | |
|---|---|
| *G11C 16/04* | (2006.01) |
| *G11C 16/30* | (2006.01) |
| *G11C 16/32* | (2006.01) |
| *G11C 5/06* | (2006.01) |
| *G11C 16/26* | (2006.01) |

(Continued)

(52) U.S. Cl.
CPC .......... *G11C 16/0433* (2013.01); *G11C 5/025* (2013.01); *G11C 5/06* (2013.01); *G11C 16/0483* (2013.01); *G11C 16/08* (2013.01); *G11C 16/10* (2013.01); *G11C 16/102* (2013.01); *G11C 16/26* (2013.01); *G11C 16/30* (2013.01); *G11C 16/32* (2013.01)

(58) Field of Classification Search
CPC ....... G11C 16/0433; G11C 5/025; G11C 5/06; G11C 16/0483; G11C 16/08; G11C 16/10; G11C 16/102; G11C 16/26; G11C 16/30; G11C 16/32; G11C 7/04; G11C 16/3418; G11C 8/08; H10B 41/20
See application file for complete search history.

(56) References Cited

U.S. PATENT DOCUMENTS 3,858,232 A * 12/1974 Boyle .................. G11C 19/282
257/E29.232
4,905,063 A    2/1990 Beltram et al.
(Continued)

FOREIGN PATENT DOCUMENTS

| | | |
|---|---|---|
| JP | 54-6177 B2 | 3/1979 |
| JP | 2-72673 A | 3/1990 |

(Continued)

OTHER PUBLICATIONS

U.S. Appl. No. 17/197,667, filed Mar. 10, 2021, Tomoya Sanuki, et al.

(Continued)

*Primary Examiner* — Jay W. Radke
(74) *Attorney, Agent, or Firm* — Oblon, McClelland, Maier & Neustadt, L.L.P.

(57) ABSTRACT

A memory system has a memory cell array having a plurality of strings, the plurality of strings each having a plurality of memory cells connected in series, and a controller configured to perform control of transferring charges to be stored in the plurality of memory cells in the string or transferring charges according to stored data, between potential wells of channels in the plurality of memory cells.

19 Claims, 14 Drawing Sheets

(51) Int. Cl.
*G11C 5/02* (2006.01)
*G11C 16/10* (2006.01)
*G11C 16/08* (2006.01)

(56) References Cited

U.S. PATENT DOCUMENTS

| | | | |
|---|---|---|---|
| 7,369,377 | B1 | 5/2008 | Hennessy et al. |
| 7,911,265 | B2 | 3/2011 | Dzurak et al. |
| 8,107,286 | B2 | 1/2012 | Itagaki et al. |
| 8,295,097 | B2 | 10/2012 | Cho et al. |
| 8,426,908 | B2 | 4/2013 | Higashi |
| 2011/0090744 | A1* | 4/2011 | Cho ............... G11C 16/32 365/185.25 |
| 2017/0110402 | A1 | 4/2017 | Smith et al. |
| 2018/0261529 | A1 | 9/2018 | Yoshimizu et al. |
| 2019/0164985 | A1 | 5/2019 | Lee et al. |
| 2022/0011963 | A1 | 1/2022 | Sanuki et al. |

FOREIGN PATENT DOCUMENTS

| | | |
|---|---|---|
| JP | 3260010 B2 | 2/2002 |
| JP | 4913188 B2 | 4/2012 |
| JP | 4922370 B2 | 4/2012 |
| JP | 2022-14710 A | 1/2022 |

OTHER PUBLICATIONS

Fred Ware, et al., "Do Superconducting Processors Really Need Cryogenic Memories? The Case for Cold DRAM", MEMSYS, 2017, 6 pages.

Wriddhi Chakraborty, et al, "An Empirically Validated Virtual Source FET Model for Deeply Scaled Cool CMOS", IEDM, 2019, 4 pages.

Miryeong Song, et al., "Evaluation of Commercial-Off-The-Shelf (COTS) Electronics for Extreme Cold Environments", Aerospace Conference, 2018, 11 pages.

Fiona Wang, et al., "DRAM Retention at Cryogenic Temperatures", IMW, 2018, 4 pages.

Jong-Ho Bae, et al., "Characterization of a Capacitorless DRAM Cell for Cryogenic Memory Applications", IEEE Electron Device Letters, vol. 40, No. 10, Oct. 2019, 4 pages.

Gyu-hyeon Lee, et al., "Cryogenic Computer Architecture Modeling with Memory-Side Case Studies", ISCA, 2019, 14 pages.

Frank R. Ihmig et al., "Batch screening of commercial serial flash-memory integrated circuits for low-temperature applications", Cryogenics 71, 2015, 8 pages.

M. Shin, et al., "Low temperature characterization of 14nm FDSOI CMOS devices", Workshop of Low Temperature Electronics (WOLTE), 2014, 4 pages.

Swamit S. Tannu, et al., "Cryogenic-DRAM based Memory System for Scalable Quantum Computers: A Feasibility Study", MEMSYS, 2017, 7 pages.

G. Nicosia, et al., "A single-electron analysis of NAND Flash memory programming", Micron, 2015, 4 pages.

Shin Sakai, et al., "A back-illuminated global-shutter CMOS image sensor with pixel-parallel 14-bit subthreshold ADC", 2018 IEEE International Solid—State Circuits Conference—(ISSCC), 2018, 4 pages.

Zheng Dezhi, et al., "Low Noise CCD System Design and Implementation Based on Thermoelectric Refrigerating Unit", 2010 First International Conference on Pervasive Computing, Signal Processing and Applications, 2010, 4 pages.

Shen Wang et al., "A 47 Million Pixel High-Performance Interline CCD Image Sensor", IEEE Transactions on Electron Devices, vol. 63, No. 1, Jan. 2016, 8 pages.

Yuan Taur, et al., "High-Frequency Capacitance-Voltage Characteristics", Fundamentals of Modern VLSI Devices, 1998, 8 pages.

Hideaki Kurata, et al., "Constant-Charge-Injection Programming: A Novel High-Speed Programming Method for Multilevel Flash Memories", IEEE Journal of Solid-State Circuits, vol. 40, No. 2, Feb. 2005, 9 pages.

* cited by examiner

MEMORY SYSTEM

CROSS REFERENCE TO RELATED APPLICATIONS

This application is based upon and claims the benefit of priority from the prior Japanese Patent Application No. 2021-046262, filed on Mar. 19, 2021, the entire contents of which are incorporated herein by reference.

FIELD

An embodiment of the present invention relates to a memory system.

BACKGROUND

Since the invention and commercialization of flash memories, large-capacity and low-cost memories and storages have been continuously required. For example, in a three-dimensional NAND flash memory, the number of layers of word lines stacked in the vertical direction is increased to achieve a large capacity and low cost.

DETAILED DESCRIPTION

Figure 1:
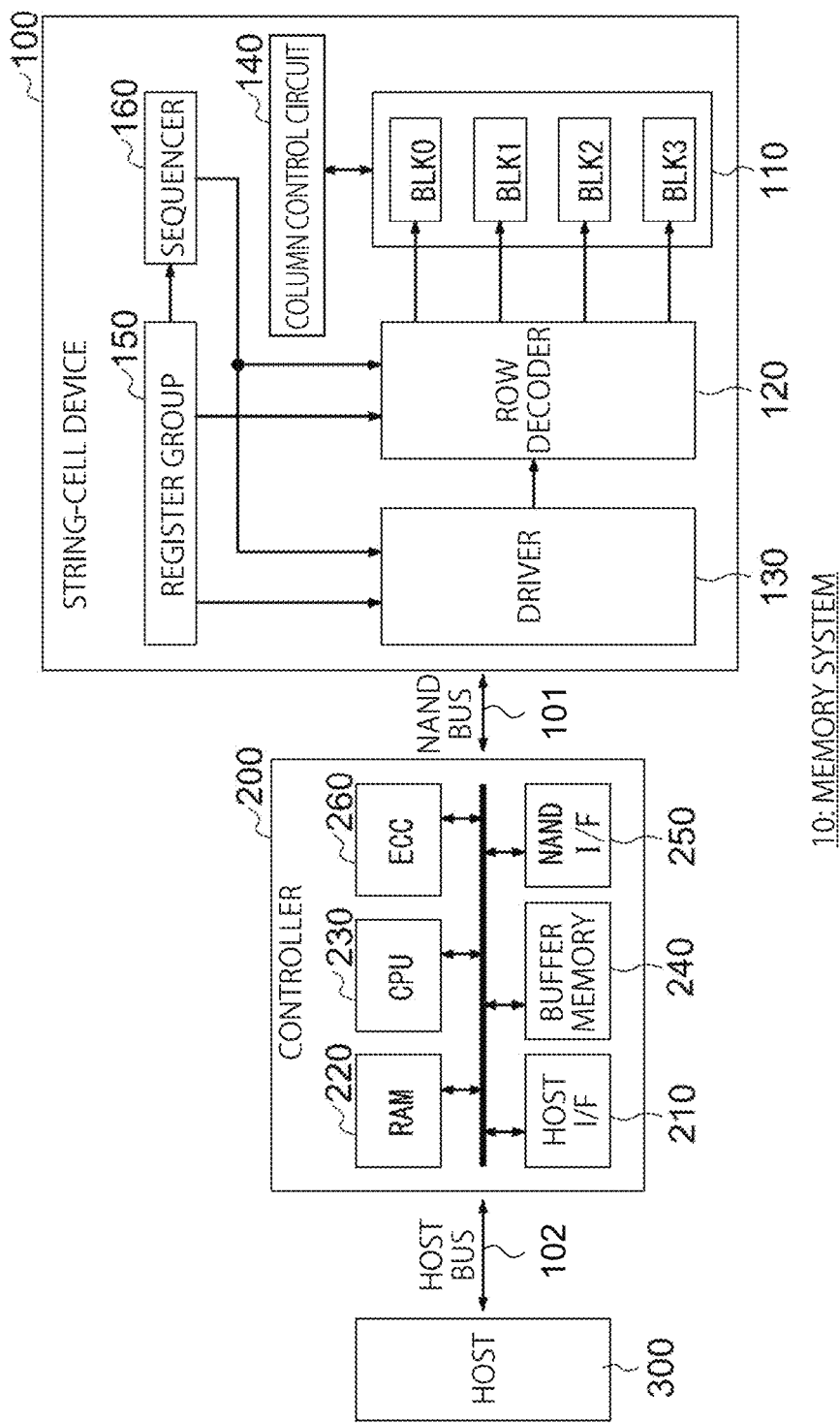
FIG. 1 is a block diagram illustrating a schematic configuration of a memory system according to an embodiment.

According to one embodiment, a memory system has a memory cell array having a plurality of strings, the plurality of strings each having a plurality of memory cells connected in series, and a controller configured to perform control of transferring charges to be stored in the plurality of memory cells in the string or transferring charges according to stored data, between potential wells of channels in the plurality of memory cells.

Hereinafter, an embodiment of a memory system is described with reference to the drawings. Hereinafter, the main components of the memory system are mainly described, but the memory system may have components and functions that are not illustrated or described. The following description does not exclude components and functions that are not illustrated or described.

The memory system according to the present embodiment includes a memory cell array and a controller. The memory cell array has a plurality of strings in which a plurality of memory cells are connected in series. The controller performs control to transfer charges to be stored in the plurality of memory cells in the string or transfer charges according to the stored data, between potential wells of channels in the plurality of memory cells.

The memory cell according to the present embodiment is a non-volatile memory, and as a specific example of the memory cell, an example in which a device structure similar to a NAND type flash memory (hereinafter, referred to as a NAND flash memory) is used is mainly described.

The memory cell according to the present embodiment has a potential well in a channel. The potential well is a place where charges passing through the channel can be temporarily held, and the depth of the potential well can be adjusted by a voltage applied to a gate. The higher the voltage applied to the gate, the deeper the potential well. As the potential well of the memory cell becomes deeper than the potential well of the adjacent memory cell, more charges can be stably held.

The controller according to the present embodiment reads and writes data in units of strings. The string is formed by connecting a plurality of the memory cells in series. In the present embodiment, a plurality of word lines (first wiring lines) connected to gates of a plurality of memory cells in the string are provided. Each of the plurality of word lines is connected to gates of two or more memory cells in the string. That is, in the present embodiment, the number of word lines is smaller than the number of memory cells in the string, and the gates of the plurality of memory cells in the string are connected to one word line.

By making voltages of two word lines connected to gates of two adjacent memory cells among the plurality of memory cells in the string different, charges are transferred from the potential well in one memory cell to the potential well in the other memory cell. When data is transferred between the potential wells in the plurality of memory cells, voltages at a plurality of predetermined voltage levels are sequentially applied to the plurality of word lines connected to the plurality of memory cells.

Hereinafter, a configuration and an operation of a memory system according to the embodiment using a device structure similar to the NAND flash memory as the memory cell are described in detail.

FIG. 1 is a block diagram illustrating a schematic configuration of a memory system 10 according to an embodiment. A memory system 10 in FIG. 1 illustrates an internal configuration of a solid state drive (SSD) using a device structure similar to a NAND flash memory.

The memory system 10 of FIG. 1 includes a string-cell device 100 having a device structure similar to that of a NAND flash memory, and a controller 200. As will be described later, there is a case in which the string-cell device 100 and the controller 200 are mounted on separate substrates.

The string-cell device 100 in FIG. 1 includes a plurality of memory cells and stores data in a non-volatile manner. The controller 200 may be connected to the string-cell device 100 by, for example, a bus 101 provided in a signal transmission cable 2 illustrated in FIG. 12 to be described later, and may be connected to the host device 300 by a host bus 102. The controller 200 controls the string-cell device 100 and accesses the string-cell device 100 in response to a command received from the host device 300. The host device 300 is, for example, an electronic device such as a personal computer, and the host bus is a bus conforming to various interfaces. The NAND bus transmits and receives signals according to a NAND interface such as Toggle IF.

The controller 200 includes a host interface circuit 210, a built-in memory (random access memory (RAM)) 220, a processor (central processing unit (CPU)) 230, a buffer memory 240, an interface circuit 250, and an error checking and correcting (ECC) circuit 260.

The host interface circuit 210 is connected to the host device 300 via the host bus, and transfers a command and data received from the host device 300 to the CPU 230 and the buffer memory 240, respectively. Also, in response to a command from the CPU 230, data in the buffer memory 240 is transferred to the host device 300.

The CPU 230 controls the entire operation of the controller 200. For example, upon receiving a write command from the host device 300, the CPU 230 issues the write command to the interface circuit 250 in response to the write command. The same applies to reading and erasing. In addition, the CPU 230 executes various types of processing for managing the string-cell device 100, such as wear leveling. The operation of the controller 200 described below may be realized by executing firmware by the CPU, or may be realized by hardware.

The interface circuit 250 is connected to the string-cell device 100 via the bus in the signal transmission cable 2 and manages communication with the string-cell device 100. Then, based on the command received from the CPU 230, the interface circuit 250 transmits various signals to the string-cell device 100 and receives various signals from the string-cell device 100. The buffer memory 240 temporarily holds write data and read data.

The RAM 220 is, for example, a semiconductor memory such as a dynamic RAM (DRAM) or a static RAM (SRAM), and is used as a work area of the CPU 230. The RAM 220 holds firmware for managing the string-cell device 100, various management tables, and the like.

The ECC circuit 260 performs error detection and error correction processing on data stored in the string-cell device 100. That is, the ECC circuit 260 generates an error correction code at the time of writing data, adds the error correction code to the write data, and decodes the error correction code at the time of reading the data.

Next, a configuration of the string-cell device 100 is described. As illustrated in FIG. 1, the string-cell device 100 includes a memory cell array 110, a row decoder 120, a driver circuit 130, a column control circuit 140, a register group 150, and a sequencer 160.

The memory cell array 110 includes a plurality of blocks BLK including a plurality of non-volatile memory cells associated with rows and columns. FIG. 1 illustrates four blocks BLK0 to BLK3 as an example. Also, the memory cell array 110 stores data given from the controller 200.

The row decoder 120 selects one of the blocks BLK0 to BLK3, and further selects a row direction in the selected block BLK. The driver circuit 130 supplies a voltage to the selected block BLK via the row decoder 120.

When reading data, the column control circuit 140 senses a signal read from the memory cell array 110 and performs a necessary operation. The signal to be read is a voltage, an amount of charge, or an amount of current. Then, the column control circuit 140 outputs data corresponding to the signal read from the memory cell array 110 to the controller 200. At the time of writing data, the write data received from the controller 200 is transferred to the memory cell array 110.

When writing data, the column control circuit 140 sends a signal corresponding to the data to be written to the memory cell array 110 via a bit line. The signal to be sent is a voltage, an amount of charge, or an amount of current.

The register group 150 includes an address register, a command register, and the like. The address register holds an address received from the controller 200. The command register holds a command received from the controller 200.

The sequencer 160 controls the entire operation of the string-cell device 100 based on various types of information held in the register group 150.

Figure 2:
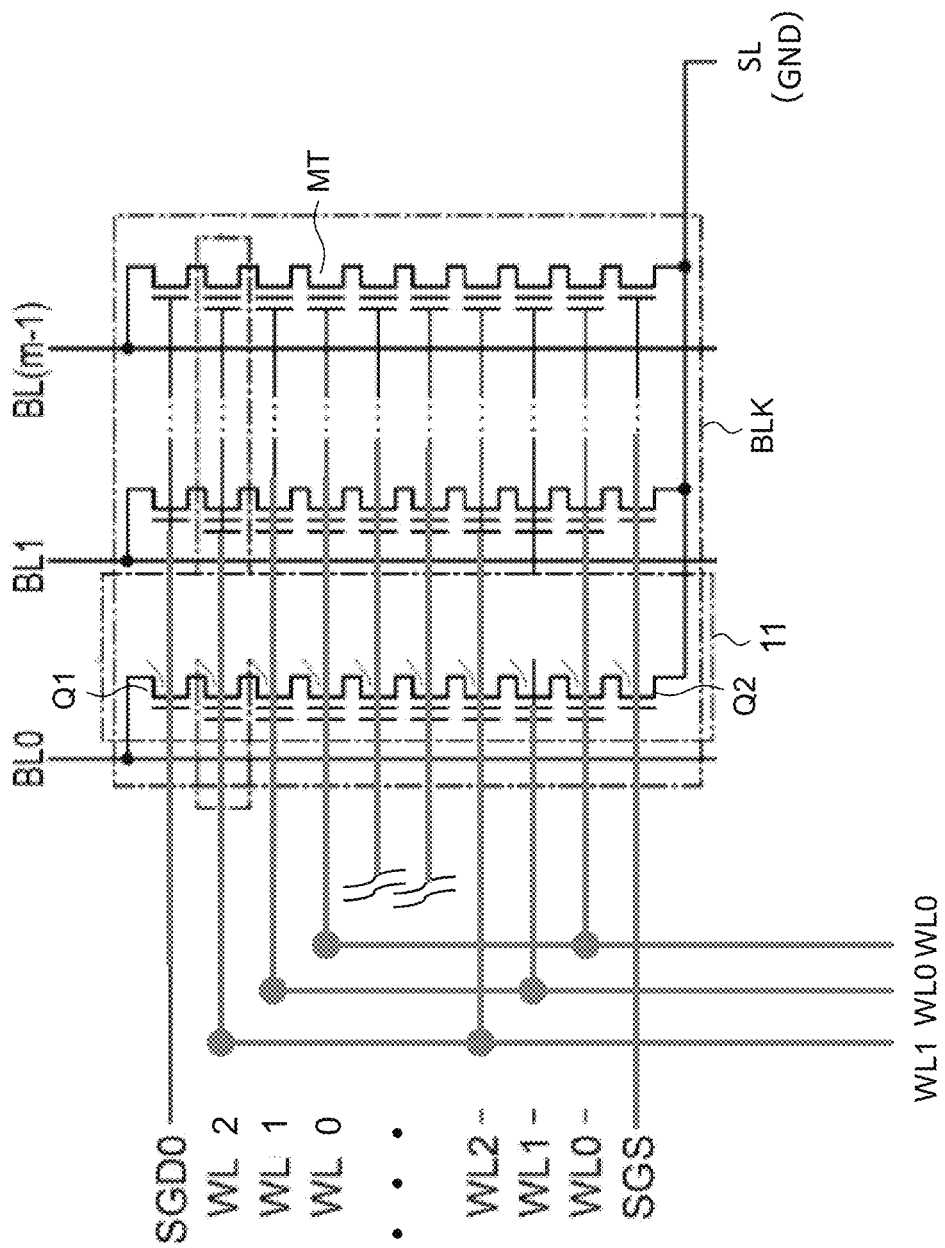
FIG. 2 is a circuit diagram illustrating an example of a memory cell array in FIG. 1.

FIG. 2 is a circuit diagram illustrating an example of the memory cell array 110 in FIG. 1. FIG. 2 illustrates an internal configuration of one block BLK in the memory cell array 110. Each block BLK has a plurality of strings 11. Each string 11 includes a plurality of memory cell transistors MT connected in series. Because the memory cell is constituted of the memory cell transistor MT, hereinafter, the memory cell transistor MT is simply referred to as a memory cell MC. Selection transistors Q1 and Q2 are connected to both ends of the plurality of memory cells MC in the string 11.

A bit line (second wiring line) is arranged for each string 11. Each bit line is connected to one end of the corresponding string 11 via the corresponding selection transistor Q1. The other end of each string 11 is connected to a common source line SL via the corresponding selection transistor Q2.

In the normal NAND flash memory, separate word lines are connected to the gates of the plurality of memory cells MC in the string 11, but in FIG. 2, three word lines WL0 to WL2 are alternately connected to the gates of the respective memory cells MC in the string 11. As a result, each word line is connected to gates of two or more memory cells MC in the string 11. As described above, in the string 11 according to the present embodiment, the number of types of word lines can be reduced as compared with a string of the normal NAND flash memory. In particular, the larger the number of memory cells MC in the string 11, the more the number of word lines can be reduced. These word lines are connected to the row decoder in FIG. 1.

(Charge Transfer Method)

Figure 3:
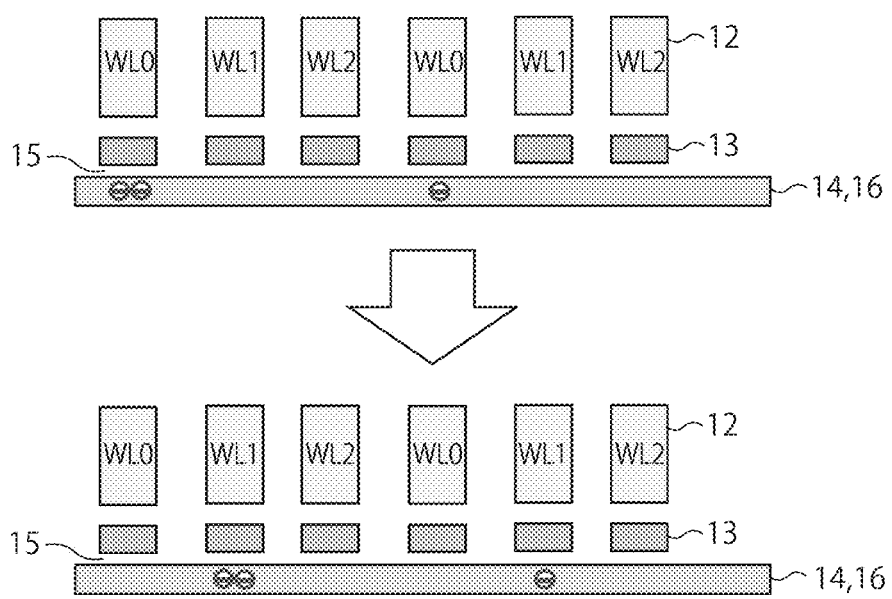
FIG. 3 is a cross-sectional view schematically illustrating a structure of a string.

Next, a charge transfer method using the string according to the present embodiment is described. FIG. 3 is a cross-sectional view schematically illustrating a structure of the string. As shown in FIG. 3, each memory cell MC in the string 11 has a floating gate 13 arranged below a gate 12 and a channel 14 arranged below the floating gate 13. A gate insulating film 15 is arranged between the floating gate 13 and the channel 14. Depending on the voltage of the gate 12, the depth of the potential well in the channel 14 varies. FIG. 3 illustrates an example in which the gates 12 of the memory cells MC in the string 11 are sequentially connected to the three word lines WL0 to WL2.

Figure 4:
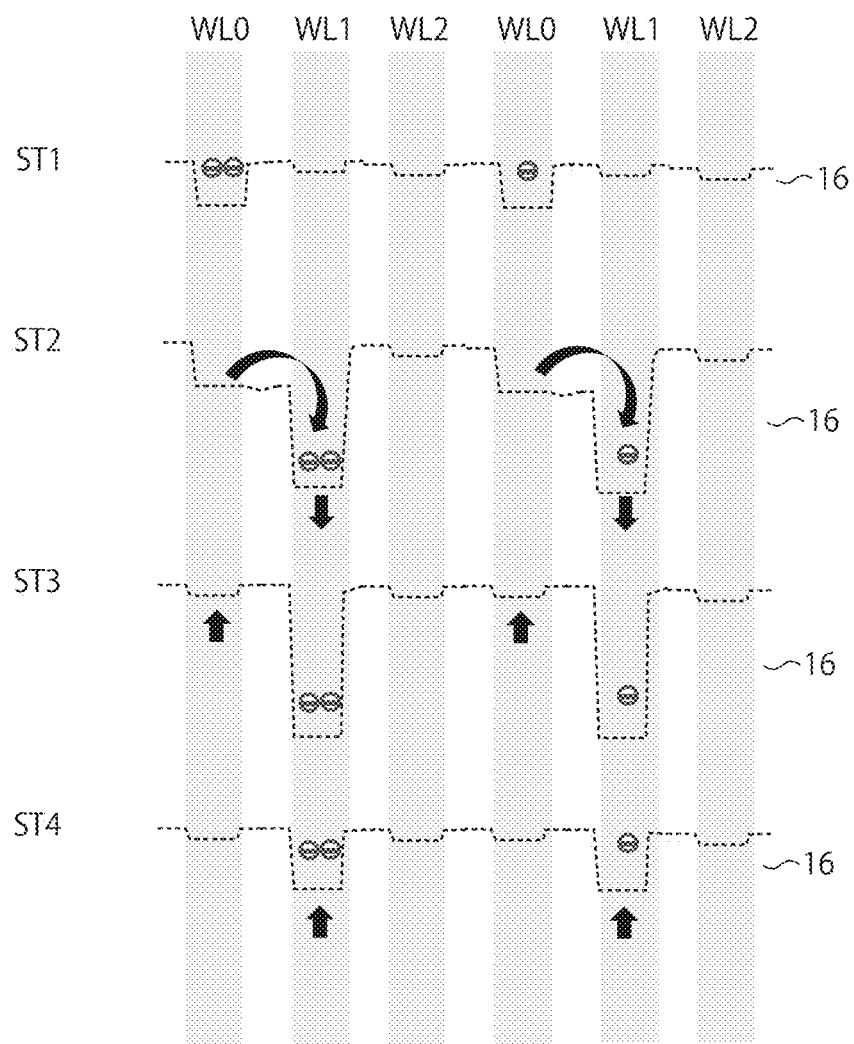
FIG. 4 is a diagram schematically illustrating a procedure of transferring a charge using the string in FIG. 3.

FIG. 4 is a diagram schematically illustrating a procedure for transferring a charge using the string 11 in FIG. 3. First, in a state ST1, the word line WL0 is set to a predetermined voltage, and charges are held in a potential well 16 in the memory cell MC connected to the word line WL0. In the state ST1 in FIG. 4, an example is illustrated in which two charges are held in the potential well 16 below the gate 12 connected to the left end word line WL0 and one charge is held in the potential well 16 in the memory cell MC connected to the third word line WL0 from the right end. The number of charges represents a difference in data, and FIGS. 3 and 4 illustrate an example of storing two types of data in a case of one charge being present and in a case of two charges being present, in the potential well 16.

Next, in a state ST2, the word line WL1 is set to a voltage higher than that of the word line WL0. As a result, the potential well 16 in the memory cell MC connected to the word line WL1 becomes deeper than the potential well 16 in the memory cell MC connected to the word line WL0. Therefore, a charge is transferred from the potential well 16 below the word line WL0 to the potential well 16 below the adjacent word line WL1. As a result, as illustrated in FIG. 3, the charges in the potential well 16 in the memory cell MC connected to the word line WL0 are transferred to the potential well 16 in the memory cell MC connected to the adjacent word line WL1.

Next, in a state ST3, the voltage of the word line WL0 is made lower than that in the state ST2. As a result, the potential well 16 below the word line WL0 becomes shallow, and the charges in the potential well 16 below the word line WL1 cannot move to the potential well 16 of the memory cell MC connected to the word line WL0 and are stably held.

Next, in a state ST4, the voltage of the word line WL1 is made lower than that in the state ST3. However, the voltage of the word line WL1 is set higher than the voltages of the word line WL0 and the word line WL2. As a result, similarly to the state ST3, the charges in the potential well 16 can be held.

As described above, by sequentially changing the voltages applied to the word lines WL0 to WL2 in at least three ways, the charges can be continuously transferred between the potential wells 16 in the plurality of memory cells MC in the string 11, the data of each memory cell MC in the string 11 can be transferred to the bit line, and the data from the bit line can be transferred to an optional memory cell MC in the string 11. Therefore, regardless of the number of memory cells MC connected in series in the string 11, charges that is to be data can be transferred to the channel portion of the optional memory cell by only three word lines WL0 to WL2.

(Reading Method)

Figure 5:
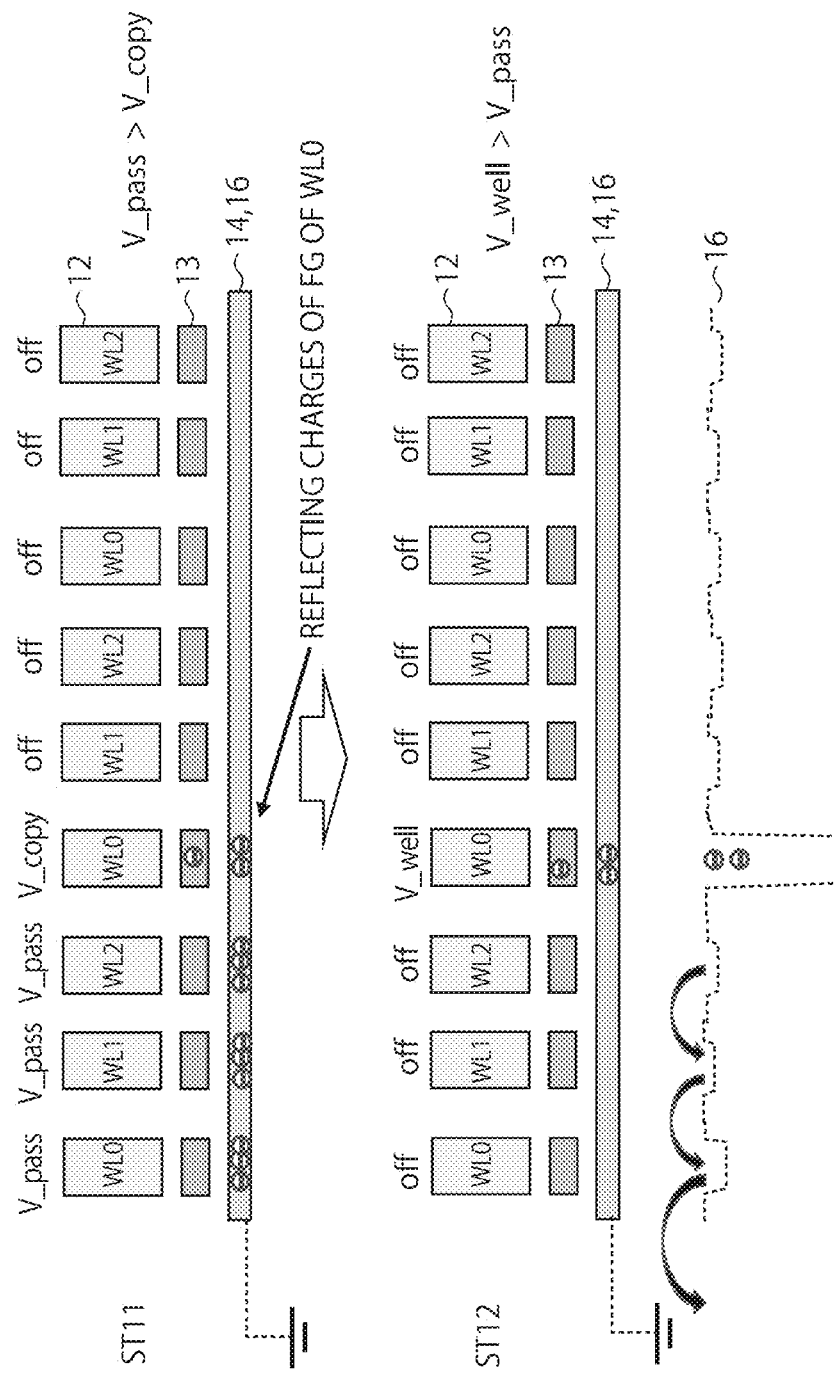
FIG. 5 is a diagram schematically illustrating a procedure of reading data stored in a memory cell in the string in FIG. 3.

FIG. 5 is a diagram schematically illustrating a procedure of reading data stored in the memory cell MC in the string 11 in FIG. 3. FIGS. 3 and 4 illustrate an example in which the charge transfer is performed by operating in parallel two or more memory cells MC connected to each of the word lines WL0 to WL2 in the string 11, but FIG. 5 illustrates an example in which a gate voltage of each memory cell MC in the string 11 is individually controlled.

First, in a state ST11, in order to read data of the fourth memory cell MC from the left end in the string 11, the word line WL0 connected to the gate 12 is set to a predetermined voltage V_copy, and a charge corresponding to the charge accumulated in the floating gate 13 is generated in the potential well 16. At this time, an example is illustrated in which the word lines WL0 to WL2 connected to the gates 12 of the first to third memory cells MC from the left end in the string 11 are set to a voltage V_pass for charge transfer, and three charges are held in each potential well 16. Here, V_pass>V_copy.

Because the first to third memory cells MC from the left end in the string 11 are not read targets, it is necessary that these memory cells MC do not hinder the charge transfer of the channel 14 in the memory cells MC being read targets. Therefore, in a state ST12, the first to third memory cells MC from the left end are turned off. As a result, the potential wells 16 in these memory cells MC becomes shallow, and the charges held in the potential wells 16 are transferred in the direction of the source line SL and discarded. By connecting one end of the string 11 to the bit line via the selection transistor Q1 and connecting the other end of the string 11 to the source line SL via the selection transistor Q2, the reference potential of the channel 14 of each memory cell MC is determined, and the time until charge is generated in the channel 14 can be shortened.

In addition, in the state ST2, a voltage V_well is applied to the word line WL0 connected to the gate 12 of the fourth memory cell MC from the left end being the read target. Here, V_well>V_pass. As a result, the potential well 16 in the memory cell MC becomes deep, and the charge generated in the state ST11 can be stably held.

FIG. 5 illustrates an example in which the gate voltage of each memory cell MC in the string 11 is individually controlled. However, in the present embodiment, because it is considered that the number of word lines connected to each of the memory cell MC is smaller than the number of memory cells MC in the string 11, data of two or more memory cells MC in the string 11 can be read in parallel.

Figure 6A:
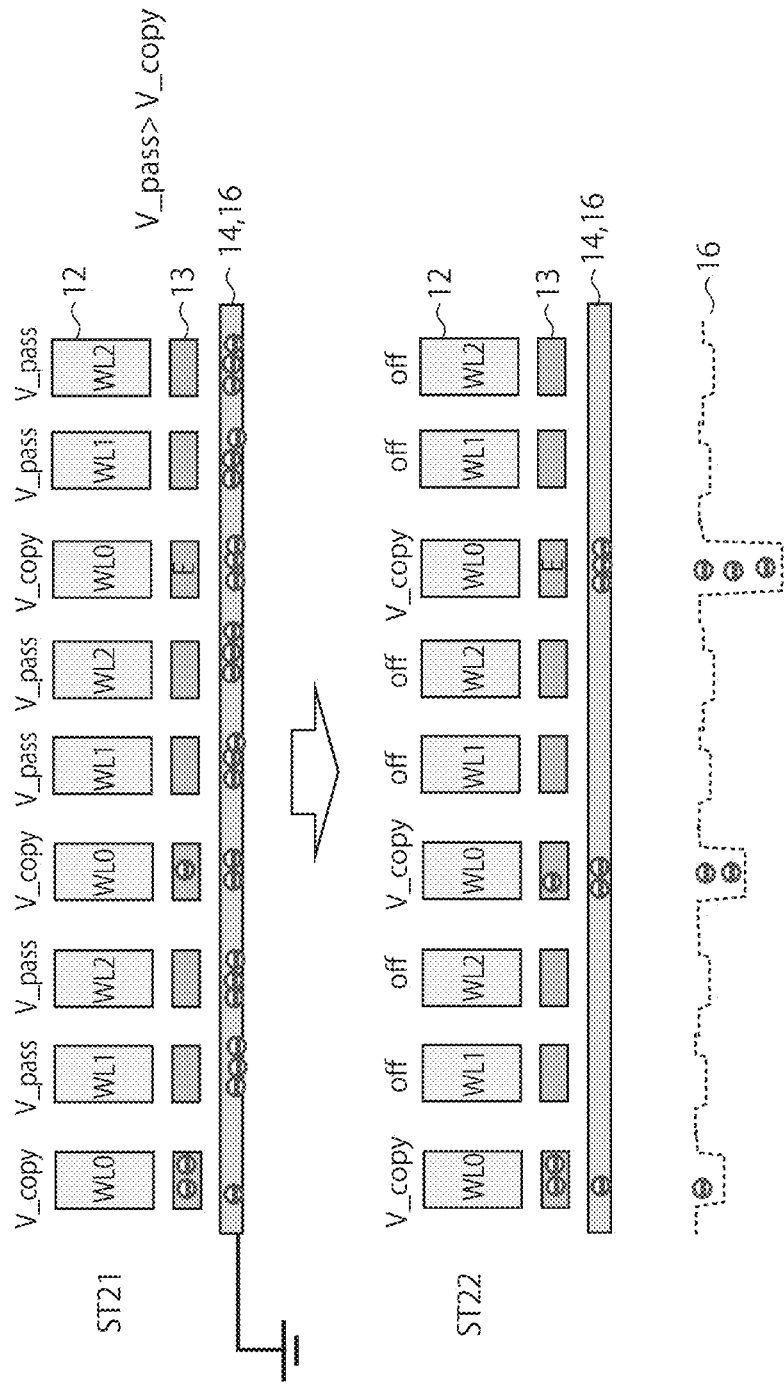
FIG. 6A is a diagram schematically illustrating a procedure of reading in parallel data of two or more memory cells in a string.
Figure 6B:
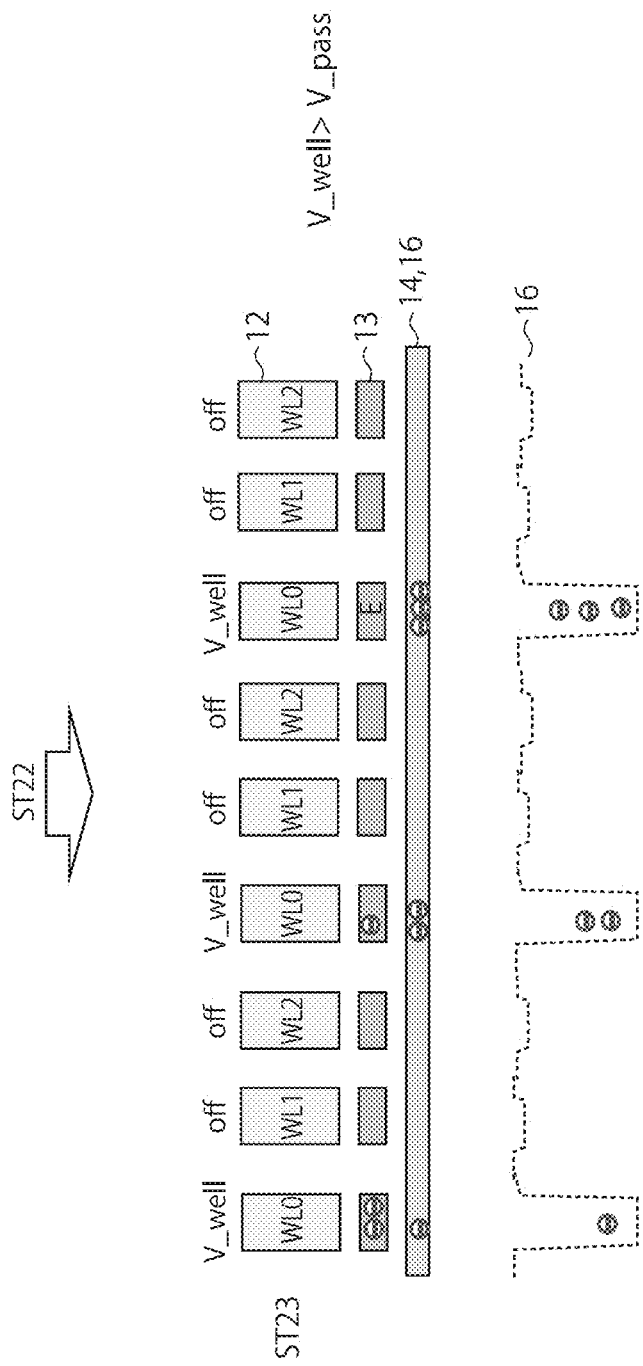
FIG. 6B is a diagram following FIG. 6A.

FIGS. 6A and 6B are diagrams schematically illustrating a procedure of reading in parallel data of two or more memory cells MC in the string 11. FIGS. 6A and 6B illustrate an example in which three word lines WL0 to WL2 are sequentially connected to the gates 12 of the plurality of memory cells MC in the string 11. In a state ST21, the word line WL0 is set to the voltage V_copy, and the word lines WL1 and WL2 are set to the voltage V_pass. Here, V_pass>V_copy. As a result, the same amount of charge (for example, three charges) is held in the potential wells 16 in the memory cells MC connected to the word lines WL1 and WL2 that are not read targets. On the other hand, charges corresponding to an amount of charge in the floating gate 13 is generated in the potential wells 16 in the memory cells MC connected to the word line WL0. FIG. 6A illustrates an example in which the charges accumulated in the floating gates 13 in the three memory cells MC connected to the word line WL0 are different from each other. Two charges are accumulated in the floating gate 13 in the memory cell MC on the left end, one charge is accumulated in the floating gate 13 in the fourth memory cell MC from the left end, and the third memory cell MC on the right side is in the erase state and has no charge accumulated in the floating gate 13. In this state, when the voltage V_copy is applied to the word line WL0, one charge is generated in the potential well 16 in the memory cell MC on the left end, two charges are generated in the potential well 16 in the fourth memory cell MC from the left end, and three charges are generated in the potential well 16 in the third memory cell MC from the right end. As the amount of charge accumulated in the floating gate 13 increases, a threshold voltage of the memory cell MC decreases, and the amount of charge generated in the potential well 16 in the channel 14 when V_copy is applied to the gate decreases. Therefore, the amount of charge generated in the potential well 16 changes for each memory cell MC according to the amount of charge accumulated in the floating gate 13.

Next, in a state ST22, the memory cells MC to which the word lines WL1 and WL2 are connected are turned off while the voltage V_copy of the word line WL0 is maintained. As a result, the potential wells 16 in the memory cells MC connected to the word lines WL1 and WL2 become shallow, and the charges generated in the potential wells 16 in these memory cell MC are discarded to the source line SL. Thereafter, in a state ST23 illustrated in FIG. 6B, by changing the voltage of the word line WL0 from V_copy to V_well, the charges can be stably held in the potential wells 16 in the memory cells MC to which the word line WL0 is connected. Thereafter, the charges held in the potential wells 16 are sequentially transferred to the bit lines by sequentially changing the voltages of the word lines WL0 to WL2.

As illustrated in FIGS. 6A and 6B, in a case in which data of a specific memory cell MC in the string 11 is read, it is necessary to transfer the charges of the potential wells 16 in the memory cells MC being the read targets after discarding the charges of the potential wells 16 in the memory cells MC not being the read targets. Therefore, it is desirable to quickly discard the charges of the potential well 16 in the memory cell MC not being the read target and to speed up the setup time for reading the data in the memory cell MC being that read target.

Figure 7:
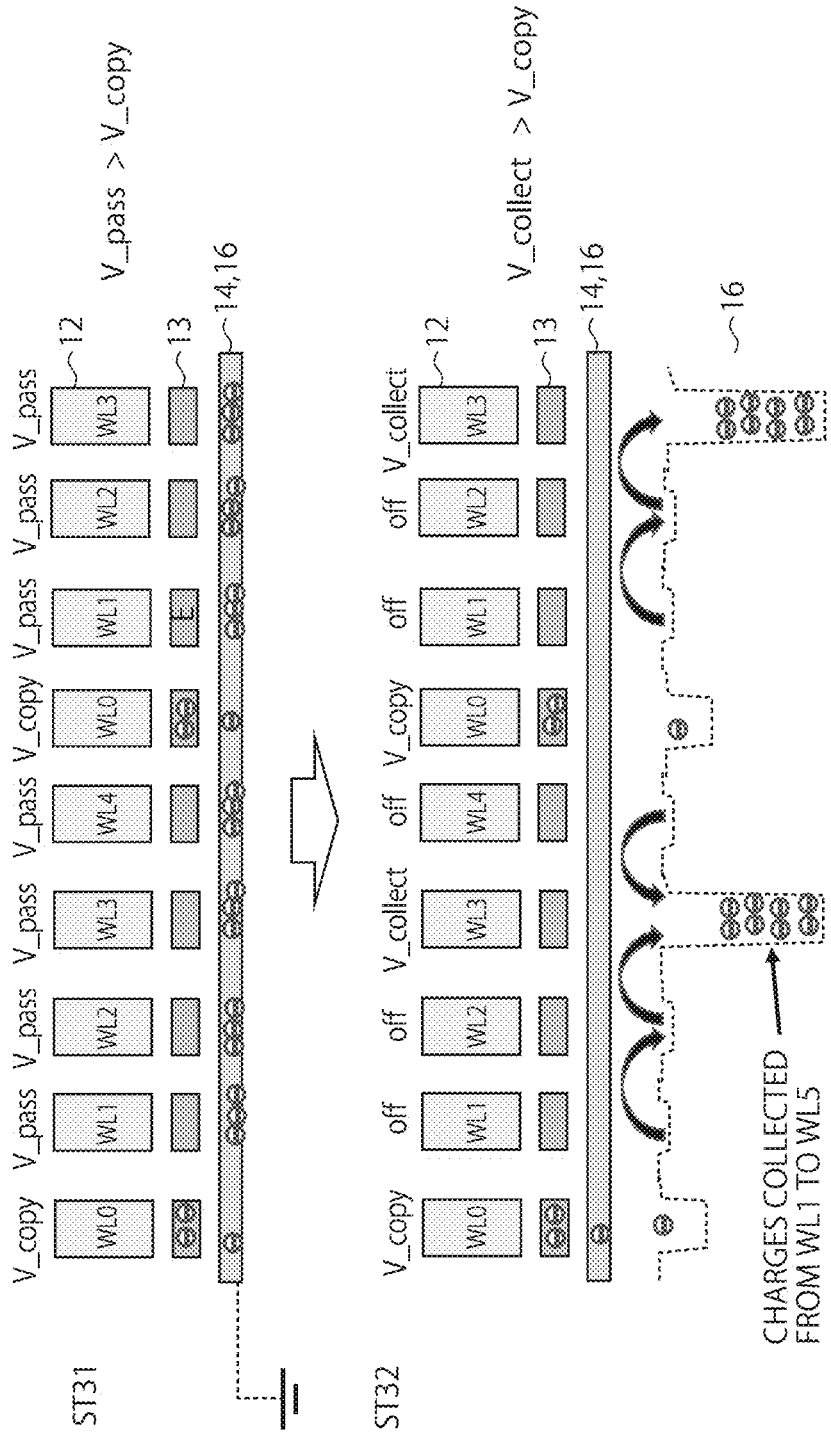
FIG. 7 is a diagram schematically illustrating a reading procedure for speeding up a setup time.

FIG. 7 is a diagram schematically illustrating a reading procedure for speeding up the setup time. FIG. 7 illustrates an example in which five word lines WL0 to WL4 are sequentially connected to the gates 12 of the plurality of memory cells MC in the string 11. One of the five word lines WL0 to WL4 is used to collect charges of the potential wells 16 in the memory cells MC not being the read targets into one. A voltage of the word line for this purpose is defined as V_collect. Here, V_collect>V_copy. The potential wells 16 in the memory cells MC having the gates 12 to which the voltage V_collect is applied becomes deeper.

In a state ST31 of FIG. 7, similarly to the state ST21 in FIG. 6A, the word line WL0 connected to the gate 12 of the memory cell MC being the read target is set to the voltage V_copy, and the word lines WL1 to WL4 connected to the gates 12 of the memory cells MC not being the read targets are set to the voltage V_pass. As a result, charges corresponding to the charge accumulated in the corresponding floating gate 13 are generated in the potential wells 16 in the memory cells MC being the read targets. In addition, the same amount of charge (for example, three charges) is held in the potential wells 16 in the memory cells MC not being the read targets.

Next, in a state ST32, the word line WL3 connected to one gate 12 among the memory cells MC not being the read targets is set to the voltage V_collect, and the other memory cells MC not being the read targets are turned off. As a result, the potential wells 16 of the memory cells MC in the off state become shallow, and the charges held in these potential wells 16 are transferred to the potential wells 16 in the memory cell MC to which the voltage V_collect is applied. As a result, the charges of the potential wells 16 in the memory cells MC not being the read targets can be collected in one potential well 16. The charges collected in the potential well 16 can be sequentially transferred to the potential well 16 in the adjacent memory cell MC and finally transferred to the bit line and discarded.

(Writing Method)

Writing of data is performed collectively (in parallel) in one write operation for two or more memory cells MC to which the same word line in the string 11 is connected. For the writing, for example, a method called constant charge injection can be used.

Figure 8:
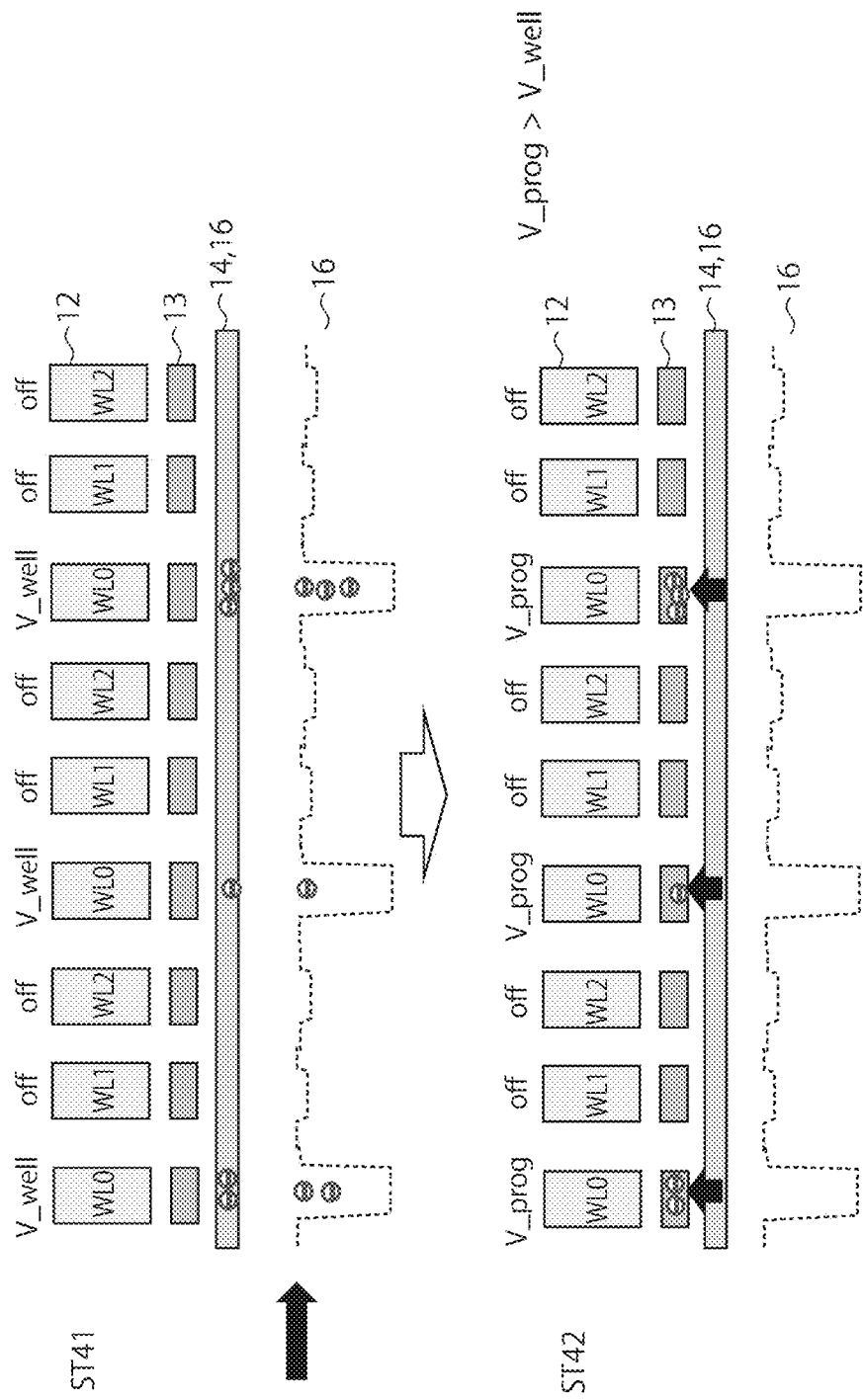
FIG. 8 is a diagram schematically illustrating a procedure of writing data to the memory cell in the string in FIG. 3.

FIG. 8 is a diagram schematically illustrating a procedure of writing data to the memory cell MC in the string 11 in FIG. 3. At the time of writing data, charges corresponding to data transferred from the bit line to the string 11 are transferred to the potential well 16 in the memory cell MC being a write target. FIG. 8 illustrates an example in which the word line WL0 is set to the voltage V_well, and data is written collectively (in parallel) to the three memory cells MC connected to the word line WL0. In the example of FIG. 8, two charges are held in the potential well 16 in the memory cell MC on the left end, one charge is held in the potential well 16 in the fourth memory cell MC from the left end, and three charges are held in the potential well 16 in the third memory cell MC from the right end. In this manner, FIG. 8 illustrates an example in which multi-value writing is performed.

Next, in a state ST42, the word line WL0 is set to a voltage V_prog. Here, V_prog>V_well. As a result, the charges in the potential wells 16 move to the floating gates 13, and data is written collectively (in parallel) in the three memory cells MC connected to the word line WL0.

The memory cell MC according to the present embodiment accumulates charges in the floating gate 13 instead of a charge trap film. By accumulating the charges in the floating gate 13, charges from the potential well 16 in the channel 14 can be accumulated in the floating gate 13 at a capture rate of about 100%.

(Structure of Memory Cell MC)

Figure 9A:
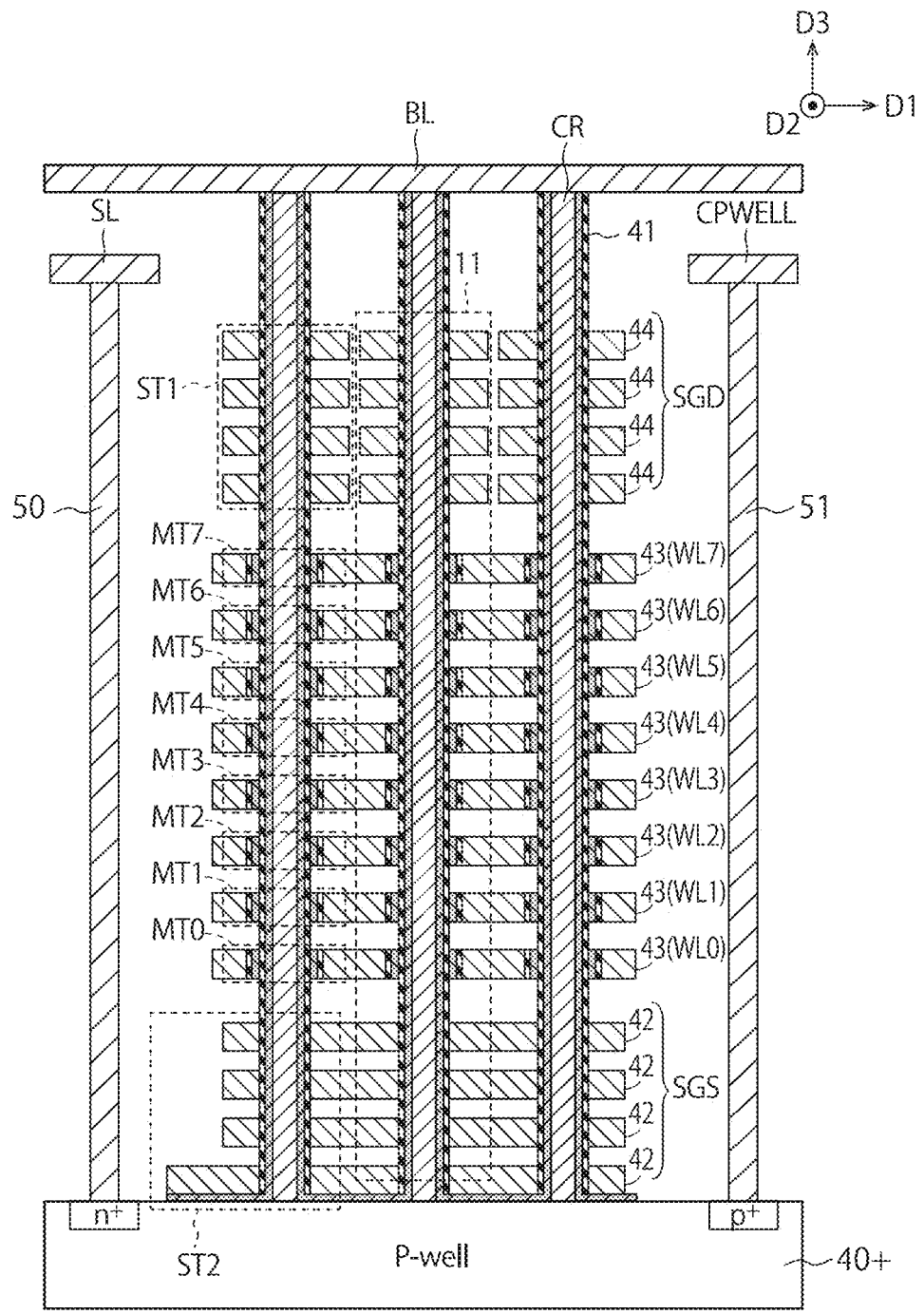
FIG. 9A is a diagram illustrating a cross-sectional structure around memory cells MC constituting the string.
Figure 9B:
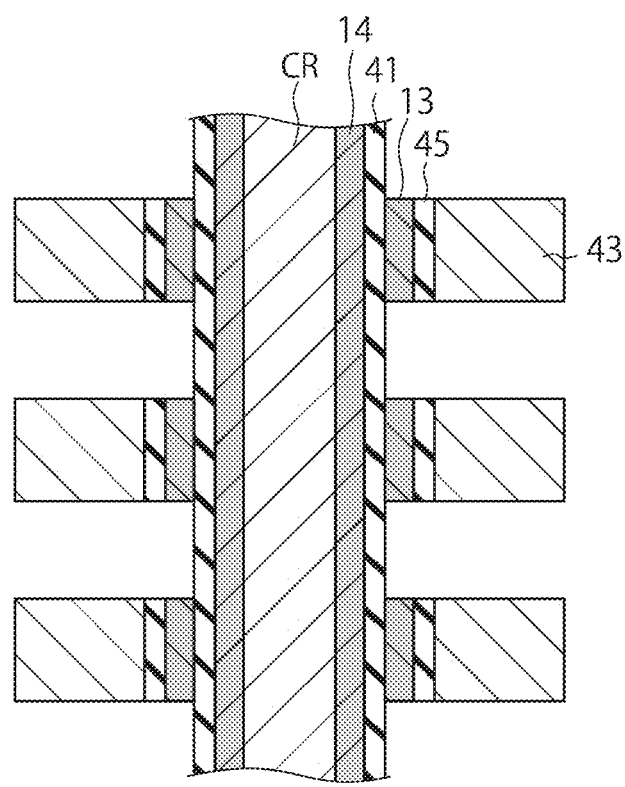
FIG. 9B is a detailed cross-sectional view of the memory cell which is a part of FIG. 9A.

The memory cell array 110 according to the present embodiment may be formed on a two-dimensional plane or may have a three-dimensional structure. Hereinafter, an example of the memory cell array 110 having a three-dimensional structure is described. FIGS. 9A, 9B, 10A, and 10B are cross-sectional views of main parts of the memory cell array 110 according to the present embodiment. More specifically, FIG. 9A illustrates a cross-sectional structure around the memory cell MC constituting the string 11, and FIG. 9B is a detailed cross-sectional view of the memory cell MC which is a part of FIG. 9A. Hereinafter, a substrate surface is referred to as a horizontal direction, and the normal direction of the substrate surface is referred to as a vertical direction.

Figure 10A:
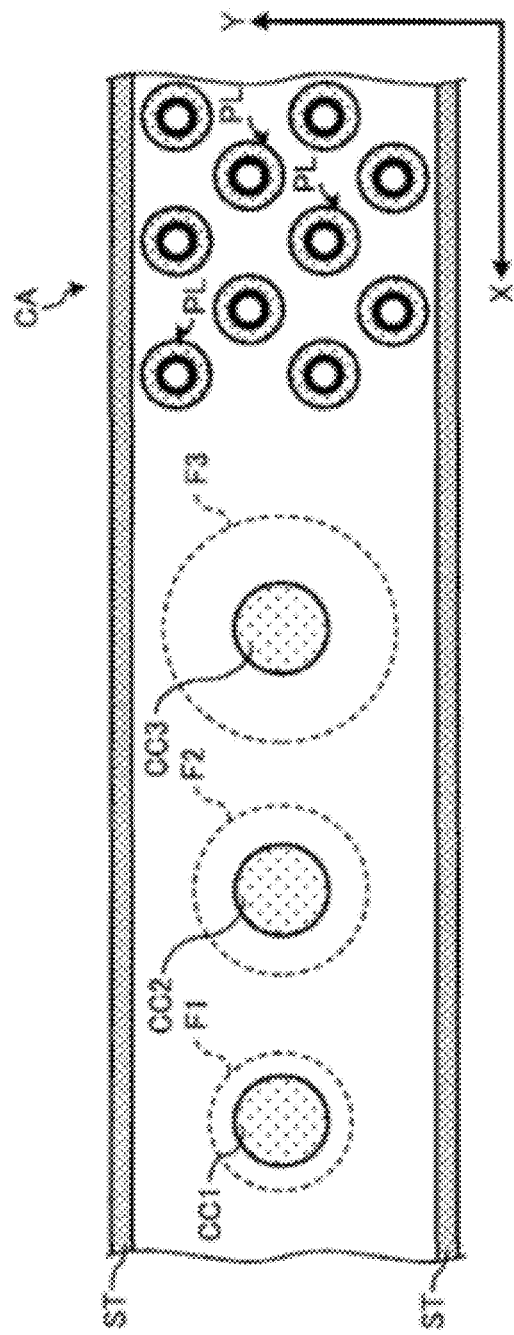
FIG. 10A is a diagram illustrating a plan view around the string.
Figure 10B:
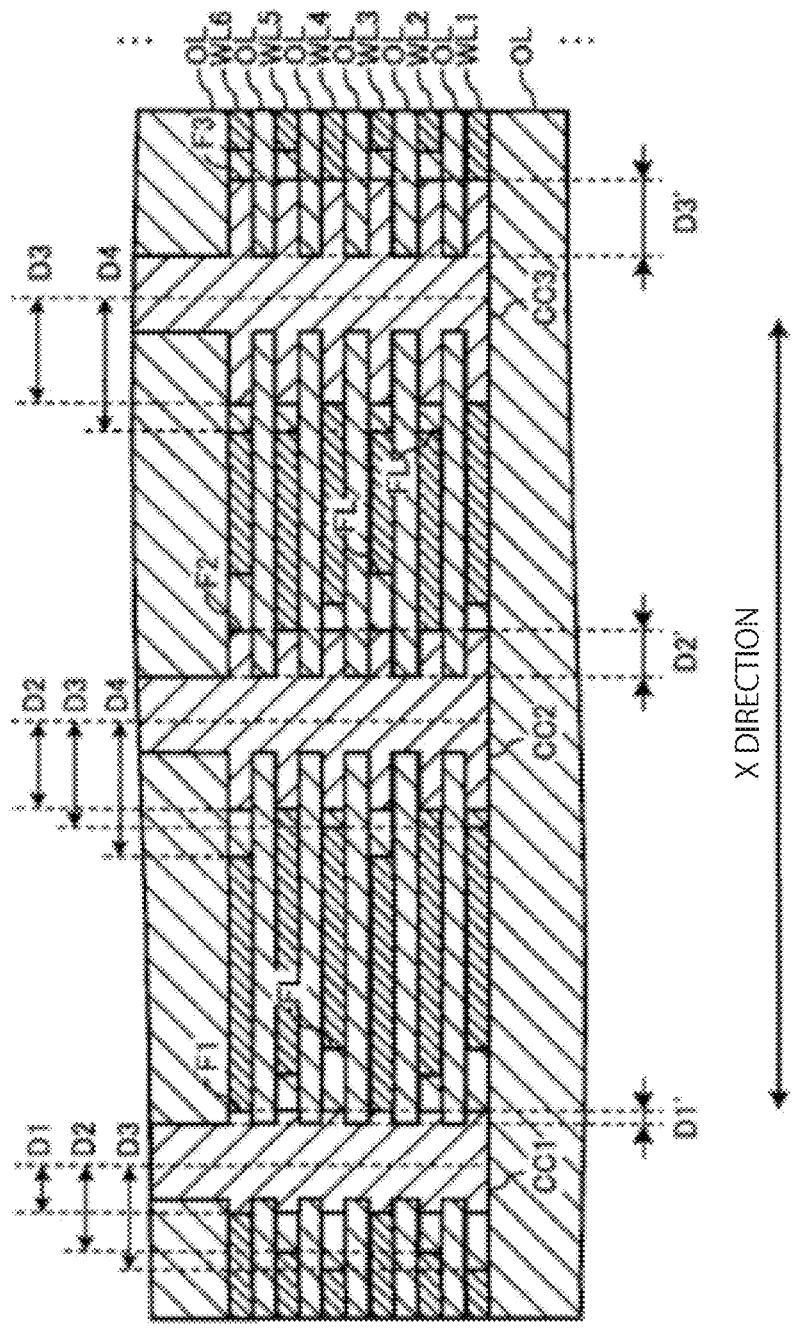
FIG. 10B is a cross-sectional view of a connection portion between a word line and a gate of the memory cell.

As illustrated in FIG. 10A, the memory cell array 110 includes a plurality of pillars PL extending in the vertical direction and a plurality of contact plugs CC1 to CC3. As illustrated in FIG. 9A, the plurality of memory cells MC are arranged at a side wall portion of each pillar PL in the vertical direction. The plurality of contact plugs CC1 to CC3 are provided corresponding to the plurality of word lines. As illustrated in FIG. 10B, each of the contact plugs CC1 to CC3 is connected to the corresponding word line at a side wall portion of the contact plugs. Hereinafter, the structures of the pillar PL and the contact plugs CC1 to CC3 are described in more detail.

As illustrated in FIG. 9A, the plurality of strings 11 are formed in the vertical direction on a p-type well region (P-well) 40 of a semiconductor substrate at a sidewall portion of a core layer CR of each pillar PL. Each string 11 has a structure in which a selection transistor SGS connected to a plurality of wiring layers 42, a plurality of memory cell transistors MT0 to MT7 connected to a plurality of wiring layers (word lines) 43, and a selection transistor SGD connected to a plurality of wiring layers 44 are stacked in the vertical direction.

As illustrated in FIG. 9B, the memory cell MC has the pillar PL having a laminated structure including the core layer CR, the channel 14, a tunnel insulating layer 41, the floating gate 13, a block insulating layer 45, and the wiring layer 43 to be a gate electrode, from the central axis toward the outer peripheral side. The plurality of word lines WL connected to the gate electrode 43 are arranged at the side wall portion of the pillar PL. The core layer CR functions as a current path of the string 11, and is a region where the channel 14 is formed during the operation of the memory cell transistor MT and the selection transistors SGS and SGD.

In addition, an n+ type impurity diffusion layer and a p+ type impurity diffusion layer are formed in the surface of the p-type well region 40. A contact plug 50 is formed on the n+ type impurity diffusion layer, and a wiring layer functioning as the source line SL is formed on the contact plug 50. A contact plug 51 is formed on the p+ type impurity diffusion layer, and a wiring layer functioning as a well wiring line CPWELL is formed on the contact plug 51. The well wiring line CPWELL is used to apply an erase voltage.

A plurality of memory cell arrays 110 illustrated in FIG. 9A are arranged in the depth direction of the paper surface of FIG. 9A, and one finger is formed by an aggregate of the plurality of strings 11 arranged in a line in the depth direction. The other fingers are formed, for example, in the left-right direction in FIG. 9A.

The bit line BL is arranged above the memory cell MC, and the column control circuit 140 illustrated in FIG. 1 is arranged beyond the bit line BL. The column control circuit 140 incorporates a read/write circuit. The memory cell array 110 can be operated as a shift register type memory by the read/write circuit. As described with reference to FIGS. 4 to 8, the shift register type memory is a string-cell device having a device structure similar to that of the NAND flash memory capable of sequentially transferring charges held in the potential well 16 in each memory cell MC.

As described above, by providing the read/write circuit in the column control circuit 140 provided beyond the bit line BL, transfer of a weak signal and reading of the signal can be performed. In addition, unlike the normal NAND memory or the like, the word line in the shift register type memory does not control writing and reading for each bit, but performs charge transfer between adjacent memory cells MC. Therefore, it is sufficient that potential modulation can be performed between the adjacent word lines, and for example, the plurality of word lines not adjacent to each other can be bundled into several sets and connected to the row decoder 120. Further, the select gate line SGD connected to a select gate STD is also connected to the row decoder 120.

In the example of FIG. 10A, the contact plugs CC1 to CC3 are arranged outside a formation region of the memory cell array 110 using the plurality of pillars PL. The upper ends of the contact plugs CC1 to CC3 are connected to the driver circuit 130 via an upper layer wiring line (not illustrated) or the like. The word lines WL0 to WL6 are arranged in the normal direction of the substrate surface so as to surround the peripheries of the contact plugs CC1 to CC3.

As illustrated in FIG. 10B, the contact plug CC1 is connected to the word lines WL2 and WL6 via flanges F1 at height positions of the word lines WL2 and WL6, and is not connected to the other word lines. The contact plug CC2 is connected to the word lines WL1 and WL5 via flanges F2 at height positions of the word lines WL1 and WL5, and is not connected to the other word lines. The contact plug CC3 is connected to the word lines WL0 and WL4 via flanges F3 at height positions of the word lines WL0 and WL4, and is not connected to the other word lines.

In this manner, the word lines WL0 to WL6 are connected to any of the contact plugs CC1 to CC3. In addition, the word lines adjacent in the stacking direction are connected to different contact plugs CC1 to CC3 among the three contact plugs CC1 to CC3.

In the present embodiment, the charges held in the potential wells 16 in the memory cells MC are sequentially transferred between the potential wells 16 of the adjacent memory cells MC to write and read data. The amount of charge held in the potential well 16 decreases as miniaturization proceeds, and the higher the multi-value level, the smaller the difference in the amount of charge held in the potential well 16. Therefore, it is necessary to write and read data under an environment in which charges in the floating gate 13 and the potential well 16 in the memory cell MC do not disappear due to heat, leakage, or the like.

In order to stably accumulate and hold the charges in the floating gate 13 and the potential well 16 in the memory cell MC, the memory cell array 110 can also be placed in an extremely low temperature environment. As a result, the charges in the floating gate 13 and the potential well 16 are less likely to disappear due to leakage. The extremely low temperature is, for example, a temperature of −40° C. or less.

Figure 11:
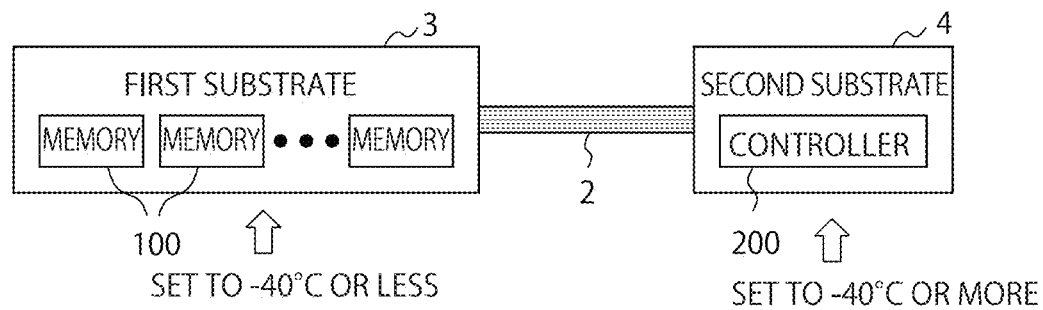
FIG. 11 is a diagram illustrating an implementation example of the memory system according to the present embodiment.

FIG. 11 is a diagram illustrating an implementation example of the memory system 10 according to the present embodiment. The memory system 10 in FIG. 11 includes a first substrate 3 and a second substrate 4 connected to each other by the signal transmission cable 2. The type of the first substrate 3 and the second substrate 4 is not particularly limited, and is, for example, a printed wiring board or a glass substrate. The type and length of the signal transmission cable 2 are not limited, but the signal transmission cable 2 has a length of, for example, several tens of centimeters or more. The signal transmission cable 2 may be, for example, a flexible printed circuit (FPC) or another signal transmission cable 2 such as a universal serial bus (USB) signal transmission cable 2. The reason of setting the signal cable to several tens of centimeters or more is to prevent heat transfer between the first substrate 3 and the second substrate 4.

The string-cell device 100 in FIG. 1 is mounted on the first substrate 3, and is set to −40° C. or less. Note that because the thermometer and the temperature sensor include measurement errors due to environmental conditions and the like, "−40° C. or less" in the present specification intends to set the target temperature to "−40° C. or less", and due to the measurement errors by the temperature sensor and the like, the temperature is possibly set to a temperature slightly higher than −40° C.

The controller 200 is mounted on the second substrate 4, and is set to −40° C. or more. The controller 200 controls writing, reading, or erasing of data to/from the memory 5 in accordance with an instruction from the host device. Because the controller 200 is constituted of a complementary metal oxide semiconductor (CMOS) circuit and an operation guarantee range thereof is generally −40° C. to 125° C., a device manufactured by a technique used in a conventional SSD product can be used.

In the example of FIG. 1, the first substrate 3 on which a memory 5 is mounted can also be immersed in, for example, liquid nitrogen. Because the liquid nitrogen can be manufactured at industrially inexpensive cost, immersion of the first substrate 3 in the liquid nitrogen itself can be realized without much cost. Additionally, because it is sufficient for the first substrate 3 to be set to the temperature of −40° C. or less, the first substrate 3 may be arranged in a refrigerant using a refrigerant other than liquid nitrogen.

Figure 12:
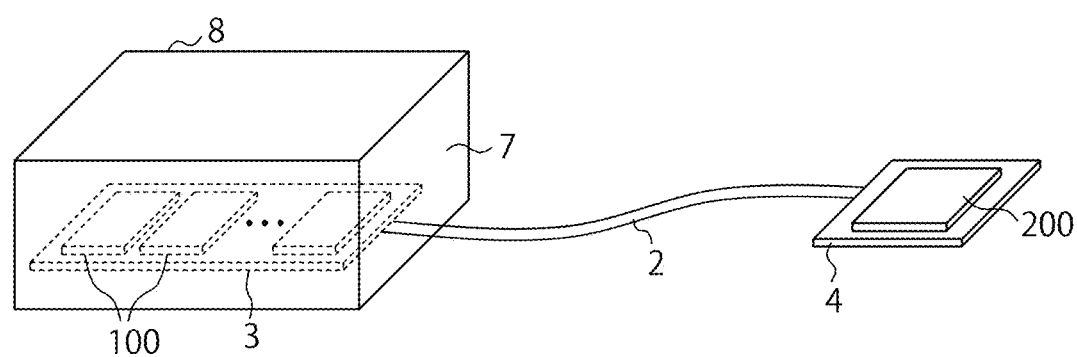
FIG. 12 is a diagram illustrating a memory system according to a first modification.

As a specific example of setting the temperature of the first substrate 3 on which the memory 5 is mounted to −40° C. or less, as in a memory system 10 according to a first modification illustrated in FIG. 12, it is conceivable to place the first substrate 3 in a housing 8 in which a refrigerant 7 of −40° C. or less is stored. The refrigerant 7 is, for example, a liquid having a boiling point of −40° C. or less, such as liquid nitrogen or liquid carbon dioxide. The refrigerant 7 is desirably obtained at low cost in addition to being required to be a substance harmless to humans. For the housing 8, it is conceivable to use a heat insulating container or the like having an opening as small as possible in order to prevent the temperature of the refrigerant 7 from rising by the refrigerant 7 coming into contact with the atmosphere and to prevent the amount of the refrigerant 7 from decreasing due to diffusion of the refrigerant 7 into the atmosphere.

On the other hand, because it is sufficient for the second substrate 4 on which the controller 200 is mounted to be set to the temperature of −40° C. or more, the second substrate 4 may be set to, for example, room temperature without using the refrigerant 7 or a cooling member. However, if there is a possibility that the controller 200 generates heat, a heat dissipation measure such as bringing a cooling member such as a heat sink into contact with the controller 200 is appropriately performed.

As described above, in the present embodiment, by sequentially transferring the charges held in the potential well 16 formed in the channel 14 in the memory cell MC to the potential well 16 in the adjacent memory cell MC, writing and reading of data to and from the plurality of memory cells MC in the string 11 are performed. Therefore, the number of word lines connected to the plurality of memory cells MC in the string 11 can be reduced, and the configuration of the memory cell array 110 can be simplified. In addition, because the potential well 16 can hold the plurality of charges and the amount of charges held by the potential well 16 can be optionally changed for each memory cell MC, multi-value data can also be written and read.

The memory system 10 according to the present embodiment can also perform writing and reading of data in a state in which the memory cell array 110 is arranged at the extremely low temperature. By arranging the memory cell array 110 at the extremely low temperature, it is possible to suppress leakage and elimination of charges in the floating gate 13 and the potential well 16 in the memory cell MC and to perform stable charge transfer.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A memory system comprising:
   a memory cell array having a plurality of strings, each of the plurality of strings having a plurality of memory cells connected in series;
   a controller configured to perform control of transferring charges to be stored in the plurality of memory cells in a string of the plurality of strings or transferring charges according to stored data, between potential wells of a channel in the plurality of memory cells in the string; and
   a plurality of first wiring lines connected to gates of the plurality of memory cells in the string, wherein each of the plurality of first wiring lines is connected to gates of two or more of the plurality of memory cells in the string.

2. The memory system according to claim 1, wherein the plurality of first wiring lines are connected to the gates of the plurality of memory cells in a sequential order along a direction of the series connected memory cells in the string.

3. The memory system according to claim 1, wherein by making voltages of two of the first wiring lines connected to gates of two adjacent memory cells among the plurality of memory cells in the string be different, the charges are transferred from a potential well in one memory cell to a potential well in another memory cell.

4. The memory system according to claim 1, wherein when charges corresponding to data are transferred between the potential wells in the plurality of memory cells in the string, the plurality of first wiring lines connected to the plurality of memory cells in the string are sequentially applied with voltages at a plurality of predetermined voltage levels.

5. The memory system according to claim 1, wherein each memory cell of the plurality of memory cells includes:
   a gate to which any one of the plurality of first wiring lines is connected; and
   a floating gate arranged between the gate and the channel, the channel includes the potential wells, each of which having a well whose depth adjusted according to a voltage of a respective gate, and
   the potential wells, each of which being included in a respective one of the plurality of memory cells in the string, are connected to each other.

6. The memory system according to claim 5, wherein a floating gate of one of the plurality of memory cells accumulates charges according to multi-value data, and a potential well of the one memory cell transfers the charges corresponding to the multi-value data.

7. The memory system according to claim 5, wherein the controller sets a voltage to be applied to a gate when the charges accumulated in a respective floating gate are to be moved to a potential well at a time of data reading to be lower than a voltage to be applied to the gate when the charges are transferred from a potential well of an adjacent memory cell at a time of data transfer.

8. The memory system according to claim 5, wherein the charges moving from a floating gate of one of the plurality of memory cells to a potential well of the one memory cell at a time of data reading decrease as the charges accumulated in the floating gate increase.

9. The memory system according to claim 5, wherein the controller moves, to corresponding potential wells of the potential wells of the channel in parallel, the charges accumulated in the floating gates in two or more of the memory cells having the gates to which the same first wiring line in the string is connected.

10. The memory system according to claim 5, wherein the controller discards charges in a potential well in a memory cell in an off state by turning off a memory cell that is not a read target.

11. The memory system according to claim 5, wherein the plurality of memory cells in the string have a memory cell for charge collection having a potential well that collects charges from a potential well in a memory cell in an off state in the string, and a first wiring line connected to the gate of the memory cell for charge collection is set to a predetermined voltage for charge collection.

12. The memory system according to claim 5, wherein after transferring the charges to potential wells of all the memory cells that are write targets among the plurality of memory cells in the string, the controller applies a program voltage higher than a voltage at a time of data transfer to a specific first wiring line connected to gates of all the memory cells that are the write targets, and transfers charges from potential wells to corresponding floating gates of all the memory cells that are the write targets.

13. The memory system according to claim 12, wherein the controller transfers, in a single write operation, the charges from the potential wells to the corresponding floating gates collectively for all the memory cells connected to the first wiring line applied with the program voltage.

14. The memory system according to claim 1, further comprising
a plurality of second wiring lines arranged on one end side of the plurality of strings, wherein
the plurality of second wiring lines transmit and receive data corresponding to charges transferred between the potential wells of the channel, each potential well being included in a respective one of the plurality of memory cells in the string.

15. The memory system according to claim 14, further comprising
a read/write control circuit that reads a signal on the plurality of second wiring lines and transmits a signal configured to write data to the plurality of second wiring lines.

16. The memory system according to claim 1, wherein the string in the memory cell array has a circuit configuration that is identical to a string in a NAND flash memory.

17. The memory system according to claim 1, further comprising:
a plurality of first conductive layers stacked on a substrate;
a plurality of second conductive layers respectively stacked between the plurality of first conductive layers;
a pillar extending in a stacking direction of the plurality of first conductive layers and the plurality of second conductive layers and having the plurality of memory cells at intersections with the plurality of first conductive layers and the plurality of second conductive layers;
a first contact plug extending in the stacking direction of the plurality of first conductive layers and the plurality of second conductive layers and connected to the plurality of first conductive layers; and
a second contact plug extending in the stacking direction of the plurality of first conductive layers and the plurality of second conductive layers and connected to the plurality of second conductive layers.

18. The memory system according to claim 1, further comprising
a first substrate having the memory cell array mounted and set to −40° C. or less; and
a second substrate having the controller mounted, set to a temperature of −40° C. or more, and configured to transmit and receive signals to and from the first substrate via a signal transmission cable.

19. The memory system according to claim 18, wherein the first substrate is arranged in liquid nitrogen.

* * * * *